US009548588B1

(12) United States Patent
Brown et al.

(10) Patent No.: US 9,548,588 B1
(45) Date of Patent: Jan. 17, 2017

(54) LOW NOISE OPTICAL PRE-AMPLIFIER FOR ULTRA-LOW-LIGHT DETECTORS AND FPAS

(71) Applicants: Robert G. Brown, Tustin, CA (US); David W. Jensen, Marion, IA (US); Steven E. Koenck, Cedar Rapids, IA (US)

(72) Inventors: Robert G. Brown, Tustin, CA (US); David W. Jensen, Marion, IA (US); Steven E. Koenck, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 116 days.

(21) Appl. No.: 14/663,687

(22) Filed: Mar. 20, 2015

(51) Int. Cl.
| | |
|---|---|
| H01S 5/32 | (2006.01) |
| H01S 5/10 | (2006.01) |
| H01S 5/042 | (2006.01) |
| H01S 5/34 | (2006.01) |
| H01S 5/30 | (2006.01) |
| H01S 5/50 | (2006.01) |
| H01L 27/146 | (2006.01) |
| B82Y 20/00 | (2011.01) |

(52) U.S. Cl.
CPC ....... *H01S 5/1078* (2013.01); *H01L 27/14609* (2013.01); *H01S 5/042* (2013.01); *H01S 5/105* (2013.01); *H01S 5/30* (2013.01); *H01S 5/3013* (2013.01); *H01S 5/3018* (2013.01); *H01S 5/3027* (2013.01); *H01S 5/32* (2013.01); *H01S 5/341* (2013.01); *H01S 5/50* (2013.01); *B82Y 20/00* (2013.01); *Y10S 977/735* (2013.01); *Y10S 977/742* (2013.01); *Y10S 977/755* (2013.01); *Y10S 977/762* (2013.01); *Y10S 977/774* (2013.01)

(58) Field of Classification Search
CPC ...... H01S 5/1078; H01S 5/3027; H01S 5/105; H01S 5/30
See application file for complete search history.

(56) References Cited

U.S. PATENT DOCUMENTS 8,921,826 B2 * 12/2014 Hayat .................... B82Y 20/00
257/13

OTHER PUBLICATIONS

U.S. Appl. No. 14/732,277, filed Jun. 5, 2015, Steven E Koenck, et al.
Purcell, E., Spontaneous emission probabilities at radio frequencies, Physical Review, vol. 69, 1946, 1 page.
Yablonovitch, E., Inhibited Spontaneous Emission in Solid-State Physics and Electronics, Physical Review Letters, vol. 58, Issue 20, May 1987, 4 pages.

* cited by examiner

*Primary Examiner* — Tony Ko
(74) *Attorney, Agent, or Firm* — Donna P. Suchy; Daniel M. Barbieri

(57) ABSTRACT

An optical pre-amplifier is described. The optical pre-amplifier has an optical amplifier region that has a semiconductor active region having a direct electronic band gap with a conduction band edge. The semiconductor active region is embedded within a photonic crystal having an electromagnetic band gap having photon energies overlapping the energy of the conduction band edge of the electronic band gap such that spontaneous emission of photons in the semiconductor active region is suppressed.

20 Claims, 4 Drawing Sheets

LOW NOISE OPTICAL PRE-AMPLIFIER FOR ULTRA-LOW-LIGHT DETECTORS AND FPAS

BACKGROUND

The present invention relates to a low noise optical pre-amplifier for low light detection, and to optical systems employing such a low noise optical pre-amplifier.

Low light level imaging is important for applications ranging from photography to night vision. One example application is in helmet mounted displays, such that may be deployed on a helmet for a pilot operating an aircraft. Other applications include astronomical imaging. Low light levels may occur, for example, for night time imaging under overcast conditions.

Light detection systems include imaging devices that may employ focal plane array (FPA) detectors. Typically, an FPA will have very many pixels, each pixel appropriate for separately detecting a plurality of impinging photons. Light detectors and FPAs, however, eventually are unable to operate in ultra-low light conditions. At long range, laser illuminator and imaging systems, typically operating at 1064 nm wavelength, also fail.

SUMMARY OF THE INVENTION

According to one embodiment, there is provided an optical pre-amplifier, comprising: an optical amplifier region comprising a semiconductor active region having a direct electronic band gap with a conduction band edge, the semiconductor active region embedded within a photonic crystal having an electromagnetic band gap having photon energies overlapping the energy of the conduction band edge of the electronic band gap such that spontaneous emission of photons in the semiconductor active region is suppressed.

According to one aspect of the embodiment, the optical amplifier region comprises a p-n junction.

According to another aspect of the embodiment, the photonic crystal comprises a photonic band gap material having a three-dimensional, two-dimensional or one-dimensional structure.

According to another aspect of the embodiment, the photonic crystal comprises a plurality of Bragg gratings.

According to another aspect of the embodiment, the semiconductor active region comprises one or more quantum well (QW) structures.

According to another aspect of the embodiment, the QWs are confined spatially into QW wires or quantum dots.

According to another aspect of the embodiment, the QWs are confined spatially in an arrangement of one or more of nanotubes, bucky balls made of carbon, graphene, germanene, or boron-nitride.

According to another aspect of the embodiment, the optical pre-amplifier further comprises one or more electrodes arranged to provide current injection into the conduction band edge of the semiconductor active region.

According to another aspect of the embodiment, the photonic crystal comprises a dielectric or semiconductor material.

According to another aspect of the embodiment, the semiconductor active region comprises at least one of group IV semiconductors, group II-VI semiconductors, or group III-V semiconductors.

According to another aspect of the embodiment, the semiconductor active region comprises a group III-V semiconductor.

According to another aspect of the embodiment, the optical pre-amplifier is configured to amplify a photon impinging on the semiconductor active region.

According to another aspect of the embodiment, the photonic crystal has a predetermined pattern of holes arranged within the semiconductor active region.

According to another embodiment, there is provided an optical detector system comprising: an optical pre-amplifier, comprising an optical amplifier region comprising a semiconductor active region having a direct electronic band gap, the semiconductor active region embedded within a photonic crystal having an electromagnetic band gap having photon energies overlapping the energy of the conduction band edge of the electronic band gap such that spontaneous emission of photons in the semiconductor active region is suppressed; and an optical detector arranged to receive and detect amplified electromagnetic radiation from the optical pre-amplifier.

According to one aspect of the embodiment, the optical pre-amplifier comprises an array of optical pre-amplifiers, and the optical detector comprises an array of optical detectors, each of the optical pre-amplifiers may correspond to a respective one of the optical detectors.

According to another aspect of the embodiment, the optical detector system is a focal plane array (FPA) detector device.

According to another aspect of the embodiment, the optical detector system comprises a dielectric spacer separating the optical pre-amplifier and the optical detector.

According to another embodiment, there is provided an optical system comprising: an optical detector system comprising: an optical pre-amplifier, comprising an optical amplifier region comprising a semiconductor active region having a direct electronic band gap, the semiconductor active region embedded within a photonic crystal having an electromagnetic band gap having photon energies overlapping the energy of the conduction band edge of the electronic band gap such that spontaneous emission of photons in the semiconductor active region is suppressed; and an optical detector arranged to receive and detect amplified electromagnetic radiation from the optical pre-amplifier; and imaging optics arranged to image electromagnetic radiation onto the optical detector system.

According to one aspect of the embodiment, the optical system is one of a camera, telescope, or microscope.

According to another aspect of the embodiment, the optical system is a head worn imaging system.

DETAILED DESCRIPTION

Figure 1:
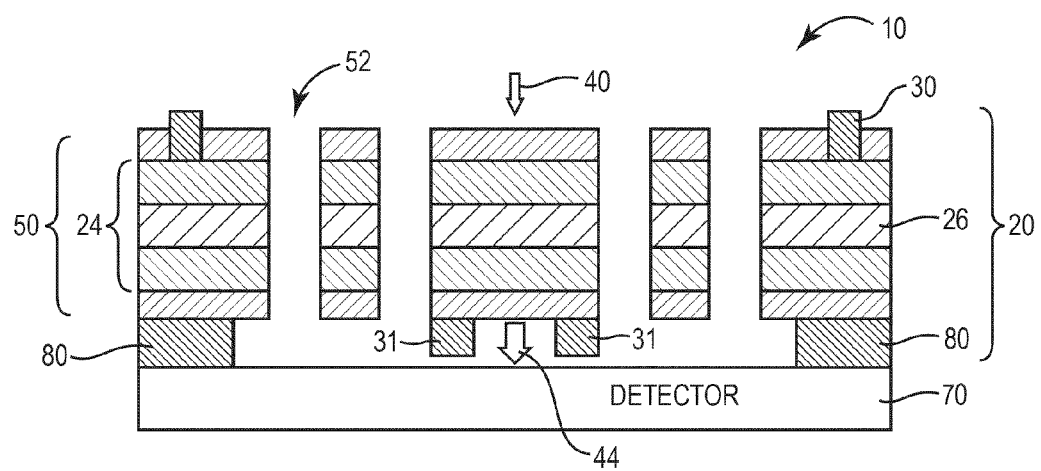
FIG. 1 is a schematic illustrating an optical detector system according to an embodiment of the invention.

In low light level imaging conditions, only a few photons per pixel may arrive each frame-time. In this case, the imaging quality in optical imaging system may be very grainy or noisy, which can render images taken at night unusable.

The present inventors have realized that a substantially improved optical imaging system is possible by amplifying those few photon arrivals per frame time per pixel by a low (near-zero) noise pre-amplifier. In particular, such a low noise pre-amplifier may be provided by disposing a semiconductor amplifier within a photonic crystal, which has a photonic band gap. By appropriately aligning the energy of the conduction band edge of electronic band gap of the semiconductor amplifier with the photon energy of forbidden wavelength within the photonic band gap, the spontaneous emissions of photons in the semiconductor amplifier may be strongly suppressed. Thus the noise due to spontaneous emissions of photons in the semiconductor amplifier within the amplification process may be strongly suppressed.

Inhibited Spontaneous Emission and Photonic Crystals

Spontaneous emission in an atom occurs when an excited state undergoes a transition to a state with a lower energy (ground state) and a photon is emitted. The rate of spontaneous emission depends partly on the environment of a photon source. This means that by placing the photon source in a special environment, the rate of spontaneous emission can be modified. The spontaneous emission rates of atoms may be enhanced when the atoms are matched in a resonant cavity due to the Purcell Effect. The enhancement is given by the Purcell factor [E. M. Purcell, "*Spontaneous emission probabilities at radio frequencies*," Phys. Rev. 69, 681 (1946)]:

$$F_P = \frac{3}{4\pi^2}\left(\frac{\lambda_c}{n}\right)^3\left(\frac{Q}{V}\right),$$

where ($\lambda_c$/n) is the wavelength within the material, and Q and V are the quality factor and mode volume of the cavity, respectively.

The use of a photonic crystal may suppress the spontaneous emission in a semiconductor, which may spontaneously emit a photon from an electronic transition from the conduction band to the valence band. Photonic crystals are periodic dielectric structures that have an electromagnetic band gap that forbids propagation of a certain frequency range of electromagnetic radiation. In particular, spontaneous emission can be suppressed by appropriate alignment of the photonic crystal band gap with respect to an electronic conduction band edge of a semiconductor material [E. Yablonovitch, '*Inhibited Spontaneous Emission in Solid-State Physics and Electronics*', Phys. Rev. Letts, 58, 2059 (1987)].

If a photonic crystal with a periodic dielectric structure has an electromagnetic band-gap that overlaps the electronic conduction band edge of the semiconductor material embedded in the photonic crystal, then spontaneous emission of photons in the semiconductor material can be suppressed. The photonic crystal may have a three-dimensional structure. Alternatively, the photonic crystal may have a two-dimensional or one-dimensional structure, such as a surrounding Bragg grating, or a surrounding thin layer of appropriately chosen refractive index. The photonic band gap structure in the photonic crystal is provided by the photonic crystal structure, which typically may have a periodic array of dielectric index values in some geometric manner, such as in glass, polymer or semiconductor.

Optical Amplification in Semiconductor Material

Optical amplification in the semiconductor material of the semiconductor active region of the pre-amplifier may be provided by electrically injecting (pumping) the semiconductor band edge of the semiconductor material suitable for amplifying an incoming photon. Appropriate semiconductor materials for optically amplifying photons impinging on the pre-amplifier may be selected from semiconductor materials appropriate for laser light amplification (although lasing does not occur in the semiconductor material of the pre-amplifier). For example, the semiconductor material of the semiconductor active region may be a Group III-V material. Alternatively, the semiconductor material may be a Group IV or Group II-VI material.

The semiconductor active region may be in the form of a p-n junction, or layers in the multiple quantum well (MQW). The semiconductor active region may be in the form of quantum wires or quantum dots.

Examples are provided below of appropriate semiconductor materials for the active material of a p-n junction for different colors/wavelengths of light:

Blue and Green: GaN;
Red: InGaP;
1064 nm and 1550 nm: InGaAs.

Examples of stacks for III-V systems for an MQW structure are provided below for different colors/wavelengths of light:

Blue: GaN/InGaN QW stack;
Green: GaN/InGaN QW stack;
Red: InGaP/InAlGaP QW stack;
1064 nm: InGaAs/AlGaAs QW stack; and
1550 nm: InGaAs/InP QW stack.

Optical Detector with Optical Pre-Amplifier

Figure 2:
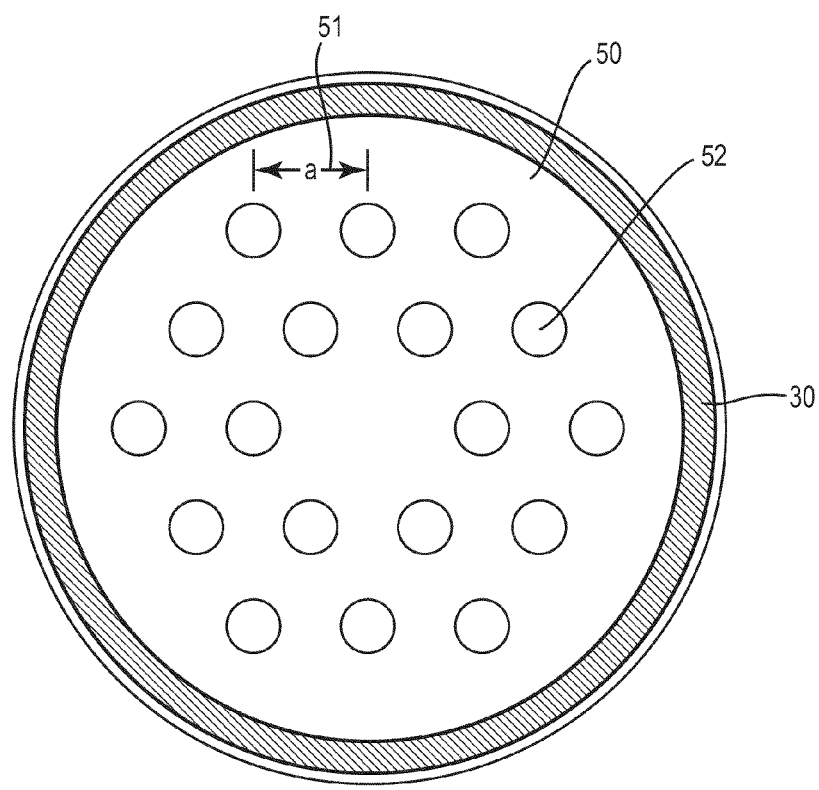
FIG. 2 is a top view of the optical detector system of FIG. 1.

FIG. 1 is a schematic illustrating an optical detector system 10 with an optical pre-amplifier 20 and an optical detector 70 according to an embodiment. FIG. 2 is a top view of FIG. 1, and shows a triangular hexagonal array pattern of holes 52 with a hole spacing a 51. The optical pre-amplifier 20 comprises an optical amplifier region 24 which has a semiconductor active region 26. An appropriate voltage is applied to the optical pre-amplifier 20 through electrode 30 and electrode 31 to inject current and pump the semiconductor conduction band edge of the semiconductor active region 26. The optical pre-amplifier amplifies the incoming electromagnetic radiation 40 impinging on the semiconductor active region 26 into outgoing radiation 44, which is directed to the optical detector 70.

The optical pre-amplifier 20 further comprises a photonic crystal 50, which is embedded within the semiconductor active region 26. In FIG. 1, the photonic crystal 50 has an array of holes 52, and a defect in the center where there is a lack of a hole. The semiconductor active region 26 of the optical amplifier region 24 is embedded within the photonic crystal 50, and in FIG. 1 the semiconductor active region 26 is a part of the photonic crystal 50.

The semiconductor active region 26 is formed of a semiconductor material which has an electronic band edge having a predetermined energy. The photonic crystal 50 has a hole size and spacing, and a dielectric constant to provide an electromagnetic band gap having a range of photon energies. Photons having energies falling with the electromagnetic band gap are forbidden to propagate within the photonic crystal 50. The photonic crystal 50 has a hole size and spacing, and a dielectric constant to provide an electromagnetic band gap such that the electromagnetic band gap has photon energies that overlap the energy of the conduction band edge of the direct electronic band gap of the semiconductor active region 26.

The outgoing radiation 44, which has been optically amplified, therefore comprises many photons. These photons may be used directly in a light amplification system for direct viewing by a user's eye, or they may be detected by an optical detector 70. The optical detector 70 may be any appropriate optical detector, such as an avalanche photodiode, CMOS photodetector, or photomultiplier, for example, where the amplified radiation is detected and converted into photo-current. Dielectric spacers 80 separate the optical detector from the optical pre-amplifier 20. An electrical connection may be made to circular ring bias contact 31 using any of a set of standard semiconductor connection methods.

Figure 3:
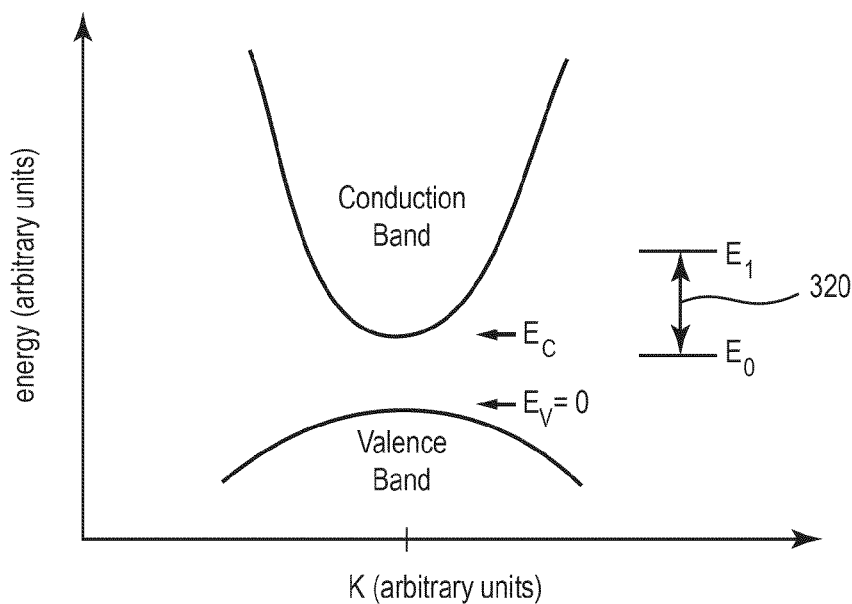
FIG. 3 is a graph illustrating the condition for the electromagnetic band gap overlapping the conduction band edge.

FIG. 3 illustrates the condition where the electromagnetic band gap has photon energies that overlap the energy of the conduction band edge of the electronic band gap, where the electronic band gap is a direct band gap. As can be seen in FIG. 3, the band energies vary as a function of the wave vector k. The electromagnetic band gap 320 in FIG. 3 has photon energies within the range of $E_0$ to $E_1$. The semiconductor has an electronic band structure with a valence band edge energy Ev, which is the highest energy in the valence band, and a conduction band edge energy Ec, which is a lowest energy in the conduction band. The valence band edge energy Ev is taken as the ground energy of zero. Thus, the electronic band gap energy is Ec. As can be seen in FIG. 3, the electromagnetic band gap 320 has photon energies that overlap the conduction band edge energy Ec. In this case, spontaneous emission of a photon based on an electronic transition from the conduction band edge to the valence band edge is prohibited.

AlGaAs Optical Preamplifier

Figure 4:
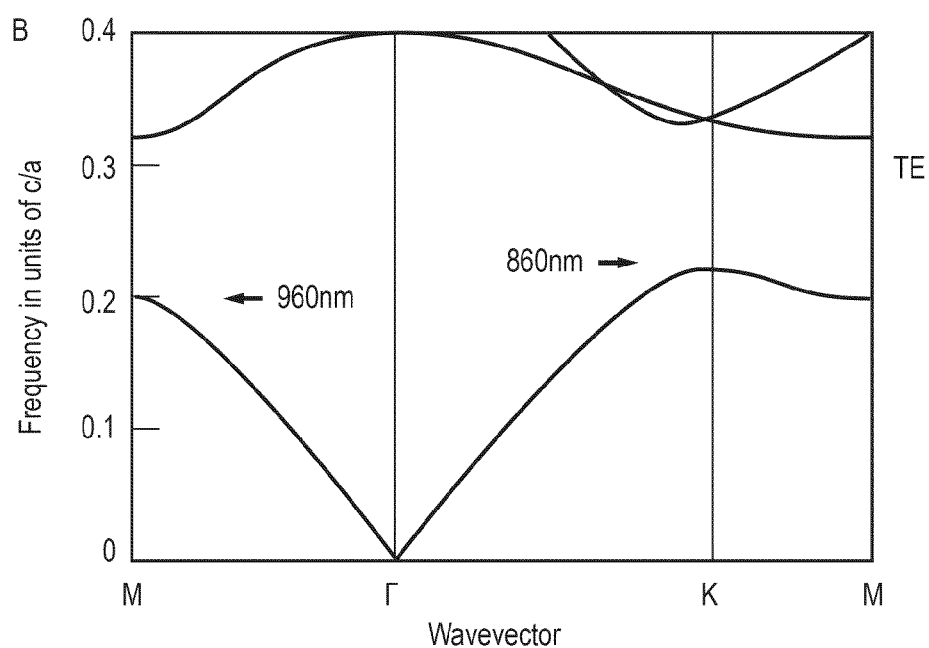
FIG. 4 is a graph illustrating the photonic band structure of a regular triangular array hole pattern in AlGaAs.

As an example, parameters for photon energies of the electromagnetic band of a photonic crystal for an AlGaAs optical preamplifier are described. The electromagnetic band structure for AlGaAs is provided in FIG. 4, where band energies are shown as a function of wave vector. FIG. 4 shows a photonic band structure of a regular triangular array hole pattern in AlGaAs. The two-dimensional photonic crystal of AlGaAs should have an electromagnetic band gap whose longest wavelength is at 860 nm, but the photonic crystal parameters may be manipulated to change both the electromagnetic band width and the longest wavelength.

The photonic crystal may be embedded in the AlGaAs material by forming a predetermined pattern of holes in the AlGaAs material. For an array of holes in the AlGaAs, the electromagnetic center energy and band width will depend upon the index of refraction of the AlGaAs, and the spacing and size of the holes. This predetermined pattern of holes can be triangular, rectangular, or quasiperiodic, or randomly spaced. In this example, the center energy and electromagnetic bandwidth may be calculated for a triangular lattice of holes with a diameter s, and a spacing between hole centers of a. AlGaAs has a core index of refraction of 3.42 at a photon wavelength of 860 nm. The effective index of refraction, $n_{eff}$ will change due to the presence of holes in the AlGaAs. The spacing a of the triangular hole lattice is ~180 nm-300 nm, the hole diameter s is ~110 nm-160 nm, and the hole heights are 750 nm or more. The bandwidth of the electromagnetic gap is ⅓ the center frequency, which provides an appropriate electromagnetic band gap for use with AlGaAs as the material for active region of the photon amplifier.

For an effective index of refraction, $n_{eff}$, a ratio of s/a=0.35 between the hole diameter and the spacing is enough for an omni-directional TE (transverse electromagnetic) electromagnetic band gap to appear. This corresponds to a fill factor of no more than 15%. A ratio s/a of 0.75, corresponding to a fill factor of 60%, would be required to simultaneously obtain complete TE and TM (transverse magnetic) gaps.

Figure 5:
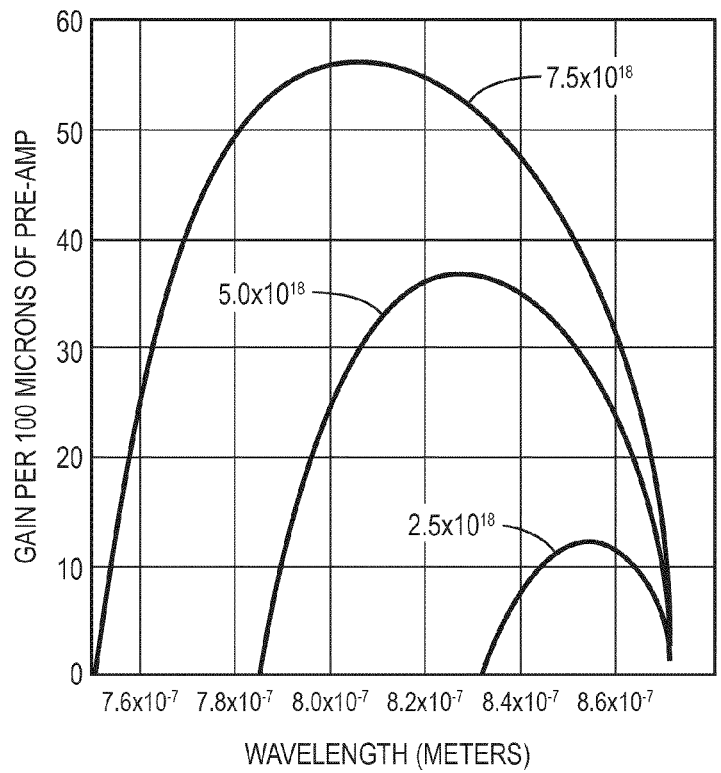
FIG. 5 is a graph illustrating a gain-bandwidth curve for an AlGaAs p-n junction amplifier.

FIG. 5 shows calculated gain-bandwidth curves for an AlGaAs p-n junction amplifier for injection currents of $2.5 \times 10^{18}$ electrons/cm$^3$, $5.0 \times 10^{18}$ electrons/cm$^3$, and $7.5 \times 10^{18}$ electrons/cm$^3$, as a function of photon wavelength over a photon wavelength range of 750 nm to 880 nm. For optimum performance, the photonic crystal should have an electromagnetic band gap that includes the range of 750 nm to 870 nm to ensure suppression of spontaneous emission over the appropriate photon amplification range of the AlGaAs detector.

While an AlGaAs detector is described above for a photon amplification range of about 760 nm to 870 nm, semiconductor materials with other photon amplification ranges are appropriate. For example, InGaAsP, with an index of refraction of 3.35, provides a photon amplification range within a band from ~1.05 microns to ~1.55 microns with a photon amplifier gain between 20× and 60×. As another example, AlGaInP, with an index of refraction of 3.56, provides a photon amplification range centered at 617 nm with a bandwidth about 617 nm of ~40 nm to ~60 nm. In any case, the crystal should have an electromagnetic band gap that includes the appropriate photon amplification range to ensure suppression of spontaneous emission over the appropriate photon amplification range of the detector.

MQW Detector System

Figure 6:
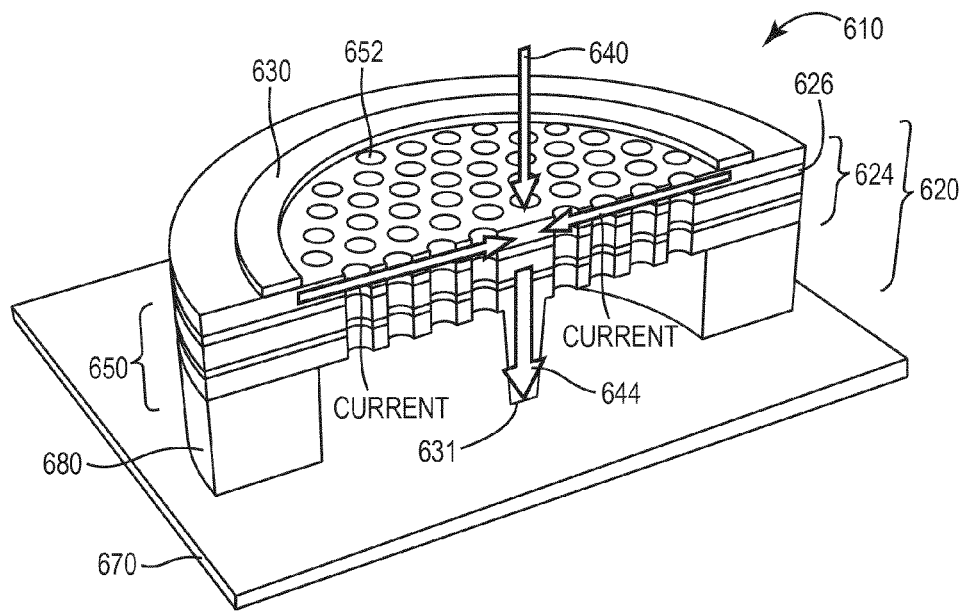
FIG. 6 is a schematic illustrating an optical detector system with an MQW structure according to an embodiment of the invention.

FIG. 6 is a schematic illustrating an optical detector system 610 with an optical pre-amplifier 620 and an optical detector 670 according to an embodiment, where the optical amplifier region 624 of the optical pre-amplifier 620 has a MQW structure. The optical amplifier region 624 has a semiconductor active region 626, comprising layers within the MQW where electronic and photonic confinement occur. The optical pre-amplifier 620 may also include current injecting electrodes 630, which function to inject current and pump the semiconductor band edge of the semiconductor active regions 626 within the MQW to allow for amplification of incoming electromagnetic radiation 640 impinging on the semiconductor active region 626 into outgoing radiation 644, which is directed to the optical detector 670.

The optical pre-amplifier 620 further comprises a photonic crystal 650, which is arranged within the semiconductor active region 626. In FIG. 6, the photonic crystal 650 has an array of holes 652, and a defect in the center where there is a lack of a hole. The semiconductor active region 626 is embedded within the photonic crystal 650, and in FIG. 6 the semiconductor active region 626 is a part of the photonic crystal 650.

The semiconductor active region 626 is formed of a semiconductor material that has an electronic band gap having a desired energy. Typical materials for a MQW structure are semiconductor heterojunctions formed of one or more of: InAs, InGaAs, GaAs and AlGaAs. The photonic crystal 650 has a hole size and spacing, and a dielectric constant to provide an electromagnetic band gap having photon energies. Photons having energies falling with the electromagnetic band gap are forbidden to propagate within the photonic crystal 650. The photonic crystal 650 has a predetermined pattern of hole sizes and spacings, and a dielectric constant to provide an electromagnetic band gap such that the electromagnetic band gap has photon energies that overlap the energy of the conduction band edge of the electronic band gap such that spontaneous emission of photons in the semiconductor active region 626 is suppressed.

The outgoing radiation 644, which has been optically amplified is detected by an optical detector 670. The optical detector 670 may be any appropriate optical detector, such as an avalanche photodiode, or photomultiplier, for example where the amplified radiation is detected and converted into photo-current. Dielectric spacers 680 separate the optical detector from the optical pre-amplifier 620. An electrical contact 631 provides a return path for the pumping current.

Figure 7:
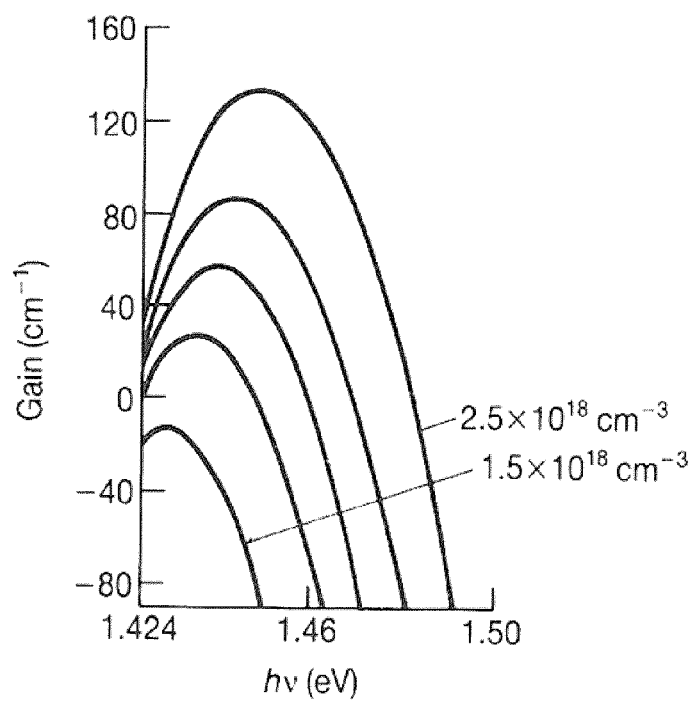
FIG. 7 is a graph illustrating the gain as a function of photon energy for various carrier densities.

The MQW structure of FIG. 6 provides good gain qualities. One of the advantages of a narrow active MQW region for gain is the expectation of low gain threshold current densities. The carrier (e) density n in a quantum-well structure is given by:

$$n=(J\tau)/(eL),$$

where J is the gain-threshold current, $\tau$ is the carrier lifetime, e is the carrier charge, and L is the QW width. There is a minimum value of J, the gain-threshold current, needed to overcome any losses in the amplifier. This has a dependency on the carrier density n as shown in FIG. 7, which illustrates carrier density curves between $1.5 \times 10^{18}$ electrons/cm$^{-3}$ and $2.5 \times 10^{18}$ electrons/cm$^{-3}$. At the onset of gain, n is usually $\sim 1\text{-}3 \times 10^{18}$ cm$^{-3}$, depending on the emission wavelength. If the QW width L is made smaller, J can be made correspondingly smaller to maintain n. J is usually in the region 100-300 A/cm$^2$ for the threshold of positive amplification.

The MQW structure may be confined within a photonic band gap structure, where the MQW is within one-dimensional, two-dimensional, or three-dimensional photonic crystal microcavities. Such microcavities may comprise nanotubes, rolled graphene, germanene, boron nitride sheets, bucky balls of $C_{60}$, QW-wires or quantum dots, for example.

The optical pre-amplifier using MQW structure, as well as further confined quantum-wire and quantum dot structures, and MQWs incorporating super-lattices, is not limited to photon detection in the visible and near infra-red (NIR), but may be applicable to the Mid-wave infra-red (MWIR) (~3-5 microns), Long-wave infra-red (LWIR) (~8-14 microns) and far infra-red (~25-100 microns). Such structures may be placed inside a photonic crystal structure, such as in a manner as described above, and used for low noise optical pre-amplification.

Figure 8:
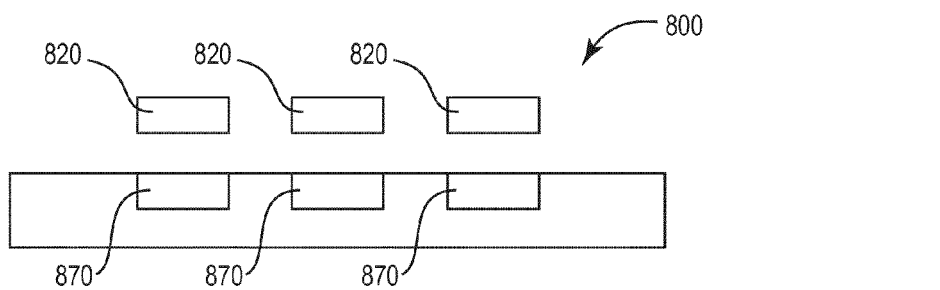
FIG. 8 is a schematic illustrating an optical detector system including an FPA according to an embodiment of the invention.

FIG. 8 is a schematic illustrating an optical detector system 800 according to an embodiment of the invention. The optical detector system 800 includes an array of optical pre-amplifiers 820, and an array of optical detectors 870. The array of optical detectors 870 may be an FPA. The optical pre-amplifiers 820 may each be a pre-amplifier 20 as shown in FIG. 1 or a pre-amplifier 620 as shown in FIG. 6, for example. The optical detectors 870 may each be an optical detector 70 as shown in FIG. 1 or an optical detector 670 as shown in FIG. 6, for example. Each of the optical pre-amplifiers 820 corresponds to a respective one of the optical detectors 870, and provides amplified electromagnetic radiation to a respective optical detector.

Figure 9:
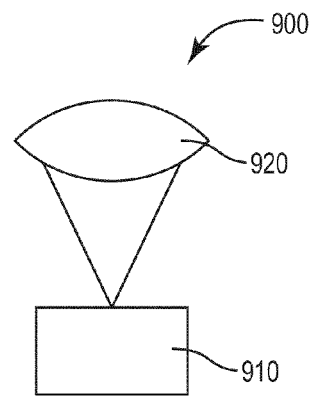
FIG. 9 is a schematic illustrating an optical system according to an embodiment of the invention.

FIG. 9 illustrates a schematic of an optical system 900 including an optical detector system 910 and imaging optics 920. The optical detector system 910 may be one of the optical detector systems 10, 610 or 800 of FIGS. 1, 6 and 8, respectively, for example. The imaging optics 920 is arranged to image electromagnetic radiation onto the optical detector system 910. The imaging optics 920 may include, for example, one or more lenses or mirrors, for example. The optical system 900 may be one of a camera, telescope, microscope, or head mounted display, for example.

The embodiments of the invention have been described in detail with particular reference to preferred embodiments thereof, but it will be understood by those skilled in the art that variations and modifications can be effected within the spirit and scope of the invention.

What is claimed is:

1. An optical pre-amplifier, comprising:
    an optical amplifier region comprising a semiconductor active region having a direct electronic band gap with a conduction band edge,
    the semiconductor active region embedded within a photonic crystal having an electromagnetic band gap having photon energies overlapping the energy of the conduction band edge of the electronic band gap such that spontaneous emission of photons in the semiconductor active region is suppressed.

2. The optical pre-amplifier of claim 1, wherein the optical amplifier region comprises a p-n junction.

3. The optical pre-amplifier of claim 1, wherein the photonic crystal comprises a photonic band gap material having a three-dimensional, two-dimensional or one-dimensional structure.

4. The optical pre-amplifier of claim 1, wherein the photonic crystal comprises a plurality of Bragg gratings.

5. The optical pre-amplifier of claim 1, wherein the semiconductor active region comprises one or more quantum well (QW) structures.

6. The optical pre-amplifier of claim 5, wherein the QWs are confined spatially into QW wires or quantum dots.

7. The optical pre-amplifier of claim 5, wherein the QWs are confined spatially in an arrangement of one or more of nanotubes, bucky balls made of carbon, graphene, germanene, or boron-nitride.

8. The optical pre-amplifier of claim 1, further comprising:
    one or more electrodes arranged to provide current injection into the conduction band edge of the semiconductor active region.

9. The optical pre-amplifier of claim 1, wherein the photonic crystal comprises a dielectric or semiconductor material.

10. The optical pre-amplifier of claim 1, wherein the semiconductor active region comprises at least one of group IV semiconductors, group II-VI semiconductors, or group III-V semiconductors.

11. The optical pre-amplifier of claim 10, wherein the semiconductor active region comprises a group III-V semiconductor.

12. The optical pre-amplifier of claim 1, wherein the optical pre-amplifier is configured to amplify a photon impinging on the semiconductor active region.

13. The optical pre-amplifier of claim 1, wherein the photonic crystal has a predetermined pattern of holes arranged within the semiconductor active region.

14. An optical detector system comprising:
    an optical pre-amplifier, comprising an optical amplifier region comprising a semiconductor active region having a direct electronic band gap, the semiconductor active region embedded within a photonic crystal having an electromagnetic band gap having photon energies overlapping the energy of the conduction band edge of the electronic band gap such that spontaneous emission of photons in the semiconductor active region is suppressed; and an optical detector arranged to receive and detect amplified electromagnetic radiation from the optical pre-amplifier.

15. The optical detector system of claim 14, wherein the optical pre-amplifier comprises an array of optical pre-amplifiers, and the optical detector comprises an array of optical detectors, each of the optical pre-amplifiers corresponding to a respective one of the optical detectors.

16. The optical detector system of claim 15, wherein the optical detector system is a focal plane array (FPA) detector device.

17. The optical detector system of claim 14, further comprising a dielectric spacer separating the optical pre-amplifier and the optical detector.

18. An optical system comprising:
an optical detector system comprising:
an optical pre-amplifier, comprising an optical amplifier region comprising a semiconductor active region having a direct electronic band gap, the semiconductor active region embedded within a photonic crystal having an electromagnetic band gap having photon energies overlapping the energy of the conduction band edge of the electronic band gap such that spontaneous emission of photons in the semiconductor active region is suppressed; and
an optical detector arranged to receive and detect amplified electromagnetic radiation from the optical pre-amplifier; and
imaging optics arranged to image electromagnetic radiation onto the optical detector system.

19. The optical system of claim 18, wherein the optical system is one of a camera, telescope, or microscope.

20. The optical system of claim 18, wherein the optical system is a head worn imaging system.

* * * * *